United States Patent
Sankar et al.

(10) Patent No.: US 9,034,491 B2
(45) Date of Patent: May 19, 2015

(54) LOW RESISTANCE AREA MAGNETIC STACK

(71) Applicant: Seagate Technology LLC, Cupertino, CA (US)

(72) Inventors: Vijay Karthik Sankar, Edina, MN (US); Mark William Covington, Edina, MN (US)

(73) Assignee: Seagate Technology LLC, Cupertino, CA (US)

( * ) Notice: Subject to any disclaimer, the term of this patent is extended or adjusted under 35 U.S.C. 154(b) by 88 days.

(21) Appl. No.: 13/690,532

(22) Filed: Nov. 30, 2012

(65) Prior Publication Data

US 2014/0154528 A1 Jun. 5, 2014

(51) Int. Cl.
| | |
|---|---|
| *G11B 5/39* | (2006.01) |
| *G01R 33/00* | (2006.01) |
| *G11B 5/31* | (2006.01) |
| *H01F 10/32* | (2006.01) |
| *G11C 11/16* | (2006.01) |
| *H01L 43/08* | (2006.01) |
| *H01L 43/12* | (2006.01) |
| *G01R 33/09* | (2006.01) |

(52) U.S. Cl.
CPC .............. *G11B 5/313* (2013.01); *G11B 5/3909* (2013.01); *H01F 10/32* (2013.01); *G11C 11/16* (2013.01); *H01L 43/08* (2013.01); *H01L 43/12* (2013.01); *G01R 33/00* (2013.01); *G01R 33/093* (2013.01)

(58) Field of Classification Search
None
See application file for complete search history.

(56) References Cited

U.S. PATENT DOCUMENTS

| | | | |
|---|---|---|---|
| 6,347,049 B1 * | 2/2002 | Childress et al. | 365/173 |
| 7,888,756 B2 * | 2/2011 | Mather et al. | 257/421 |
| 7,929,257 B2 * | 4/2011 | Machita et al. | 360/324.1 |
| 8,289,663 B2 | 10/2012 | Zhang et al. | |
| 2006/0181814 A1 * | 8/2006 | Koui et al. | 360/324.1 |
| 2008/0253039 A1 * | 10/2008 | Nagamine et al. | 360/324.2 |
| 2008/0291585 A1 * | 11/2008 | Yoshikawa et al. | 360/324.11 |
| 2009/0067232 A1 * | 3/2009 | Korenivski | 365/171 |
| 2010/0079918 A1 * | 4/2010 | Fuke et al. | 360/324 |
| 2010/0320076 A1 * | 12/2010 | Zhao et al. | 204/192.15 |
| 2011/0228428 A1 * | 9/2011 | Dimitrov et al. | 360/320 |
| 2012/0127603 A1 | 5/2012 | Gao et al. | |
| 2012/0164434 A1 | 6/2012 | Ramadas et al. | |
| 2012/0235258 A1 | 9/2012 | Zhao et al. | |
| 2012/0257298 A1 | 10/2012 | Sato et al. | |
| 2012/0267736 A1 | 10/2012 | Moon et al. | |

FOREIGN PATENT DOCUMENTS

JP     2012-114442 A    6/2012

* cited by examiner

*Primary Examiner* — Kevin Bernatz
(74) *Attorney, Agent, or Firm* — Hall Estill Attorneys at Law

(57) ABSTRACT

A magnetic element may generally be configured at least with a magnetic stack having a multilayer barrier structure disposed between first and second ferromagnetic layers. The multilayer barrier structure can have a binary compound layer disposed between first and second alloy layers with the binary compound having a metal element and a second element where at least one alloy layer has the metal element and a third element dissimilar from the second element.

20 Claims, 3 Drawing Sheets

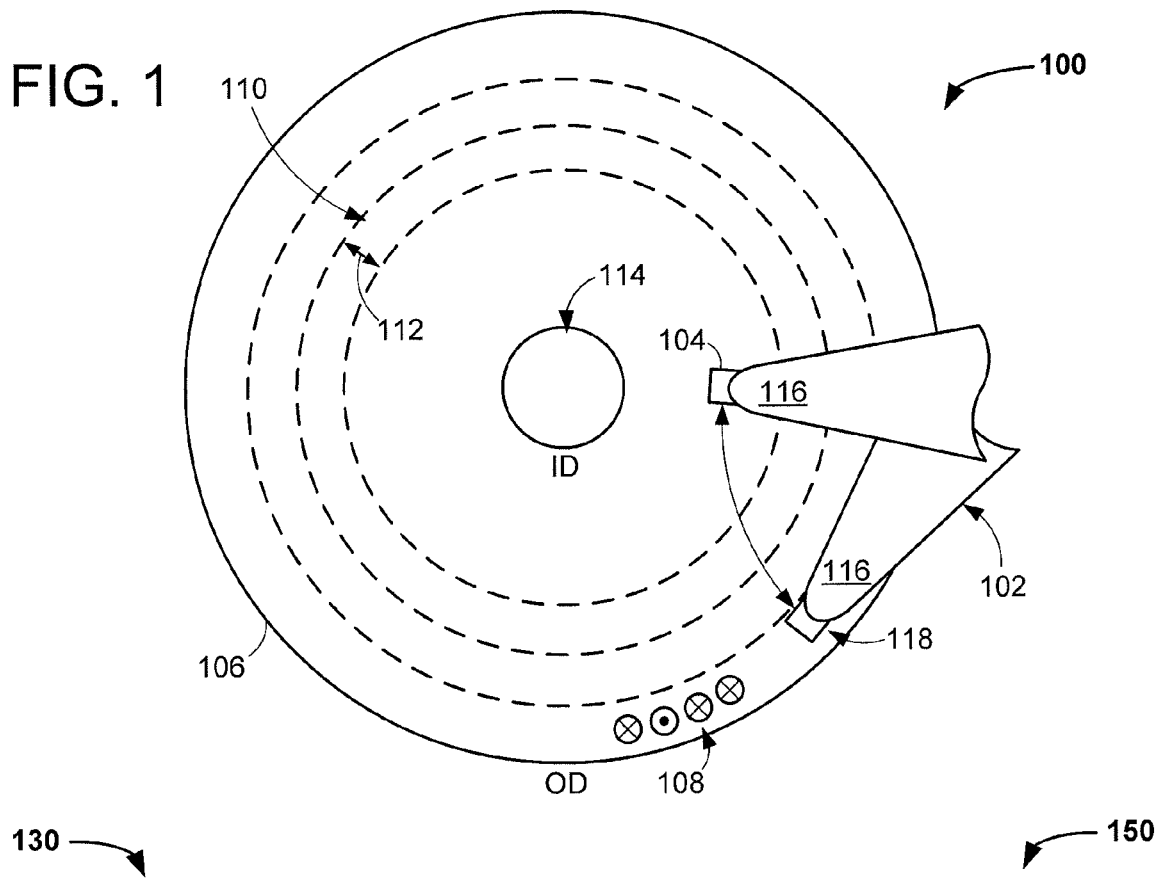
FIG. 1
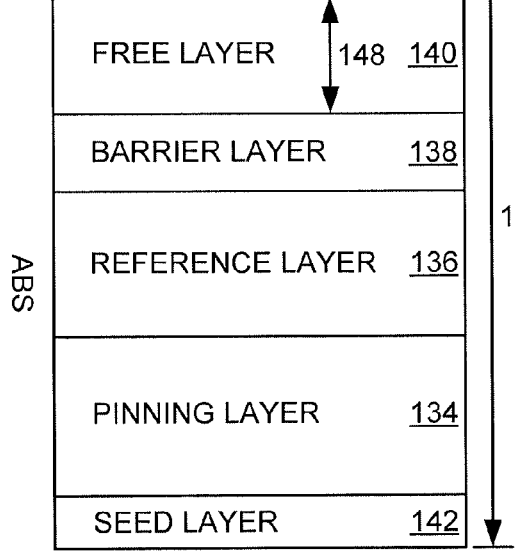
FIG. 2A
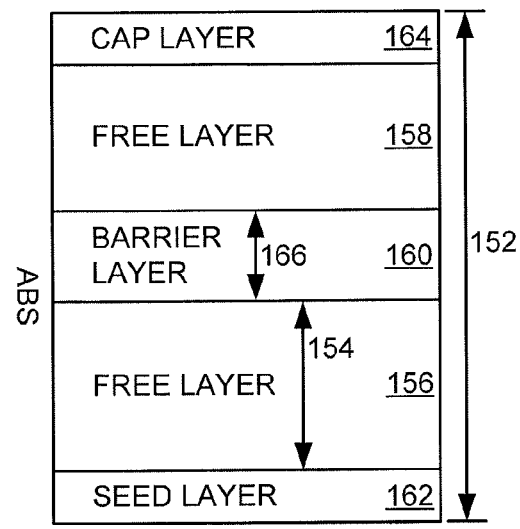
FIG. 2B
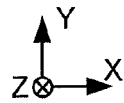

LOW RESISTANCE AREA MAGNETIC STACK

SUMMARY

Various embodiments are generally directed to a magnetic element capable of reading data bits in high areal density, reduced form factor data storage environ.

In accordance with various embodiments, a magnetic data reader may generally be configured with at least a magnetic stack having a multilayer barrier structure disposed between first and second ferromagnetic layers. The multilayer barrier structure can have a binary compound layer disposed between first and second alloy layers with the binary compound having a metal element and a second element where at least one alloy layer has the metal element and a third element dissimilar from the second element.

BRIEF DESCRIPTION OF THE DRAWINGS

FIG. 1 is a block representation of an exemplary portion of a data storage device configured and operated in accordance with some embodiments.

FIGS. 2A and 2B respectively show magnetic stack portions of exemplary magnetic elements capable of being used in the data storage element of FIG. 1.

DETAILED DESCRIPTION

Figure 3:
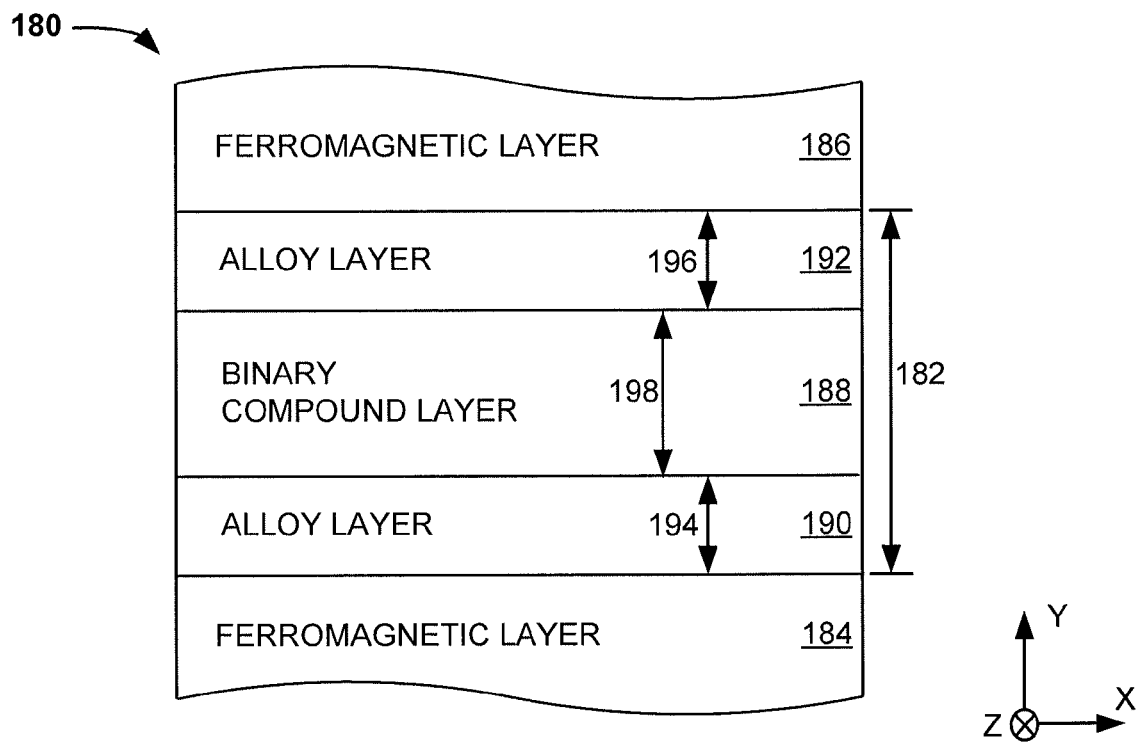
FIG. 3 displays a portion of an exemplary magnetic stack constructed in accordance with various embodiments.

As modern electronics have continually reduced in physical size while demanding more data storage capacity and data access speeds, the scalability of various data transducing components is stressed close to the brink of reliability. The increase in data bit density corresponding to tighter data tracks emphasizes the resistance-area product of a magnetic element to quickly and accurately sense data bits. The combination of reduced physical size and resistance-area product for a data reader may be dominated by minute material defects that render magnetoresistive ratio to unreliable. Hence, optimizing the resistance-area product for a reduced form factor data storage device is a continued industry interest.

Accordingly, various embodiments may generally be directed to a magnetic stack having a multilayer barrier structure disposed between first and second ferromagnetic layers, with the multilayer barrier structure having a binary compound layer disposed between first and second alloy layers and the binary compound has a metal element and a second element while at least one alloy layer has the metal element and a third element dissimilar from the second element. The ability to tune and optimize the multilayer barrier structure with different compounds can reduce the effective barrier height for the magnetic stack and lower the resistance-area for a given barrier thickness. An optimized multilayer barrier structure can further lower overall barrier thickness to allow more robust barrier materials to be used to achieve a predetermined resistance-area value.

While a tuned barrier structure can be implemented into an unlimited variety of data storage environments, FIG. 1 generally illustrates a top view block representation of an example data storage device 100 environment that can utilize a tuned magnetic element in accordance with various embodiments. The data storage device 100 is shown in a non-limiting configuration where an actuating assembly 102 is capable of positioning a transducing head 104 over a variety of locations on a magnetic storage media 106 where stored data bits 108 are located on predetermined data tracks 110 configured with a width 112 and corresponding areal density that determines the storage capacity of the media 106. Movement of the storage media 106 can be facilitated through attachment to one or more spindle motors 114 that rotate during use to produce an air bearing surface (ABS) on which a slider portion 116 of the actuating assembly 102 flies to position a head gimbal assembly (HGA) 118, which includes the transducing head 104, over a predetermined portion of the media 106.

The transducing head 104 can be configured with one or more transducing elements, such as a magnetic writer, magnetically responsive reader, and magnetic shields, which operate to program and read data from the selected data tracks 110 of the storage media 106, respectively. In this way, controlled motion of the actuating assembly 102 correspond with alignment of the transducers with the data tracks 110 defined on the storage media surfaces to write, read, and rewrite data. As data bits 108 become more densely positioned in data tracks 110 with smaller radial widths 112, the head 104 has to be responsive to smaller magnetic flux signatures with reliable accuracy, which can be problematic when the physical size of the head 104 components are reduced and especially when a material defect is present.

It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits to provide access to external data bits in any operational environment. For example, but not in any way limiting, a magnetic stack may be a data read or write configuration that can differentiate between a plurality of data bits.

FIGS. 2A and 2B respectively show magnetic stacks 130 and 150 each capable of being used in the data storage device 100 of FIG. 1. As shown in FIG. 2A, The magnetic stack 130 is constructed with a fixed magnetization pinning layer 134 contacting a fixed magnetization reference layer 136 opposite a non-magnetic barrier layer 138 from a magnetically free layer 140. As the free layer 140 responds to an external data bit while the reference layer 136 maintains a fixed magnetization due to the exchange coupling with the pinning layer 134, an external data bit can be read as a logic state. While not providing a fixed or free magnetization, seed 142 and cap 144 layers can be positioned on a single, or opposite sides of the stack 130 in various embodiments.

Construction of the abutted junction magnetic stack 130 can have a shield-to-shield spacing 146 and free layer thickness 148 that determine the magnetic extent of the stack 130 and the possible data track resolution. However, the inclusion of the reference 136 and pinning 134 layers can correspond to a smaller free layer thickness 148, high resistance-area, and reduced magnetoresistive ratio between the free 140 and reference 136 layers. With those issues in mind, the trilayer stack 150 may be used to read data bits with a reduced shield-to-shield spacing 152 and thicker free layer thickness 154 compared to the abutted junction stack 130.

In operation, the trilayer stack 150 has first 156 and second 158 magnetically free layers that are separated by a barrier layer 160 and set to default magnetizations by biasing structures external to the trilayer stack 150. The relocation of any fixed magnetization structures from the stack 150 to elsewhere allow for the reduced physical size 152 compared to the fixed magnetization having abutted junction stack 130. Even though the trilayer stack 150 may be smaller and have thicker free layers 156 and 158, the barrier layers 138 and 160 of the respective stacks 130 and 150 have presented difficulties in providing ample magnetoresistive ratios and resistance-areas capable of accurately sensing densely packed data bits.

Part of the issue facing both magnetic stacks 130 and 150 is the effective barrier height, or more specifically the electrostatic potential experienced by tunneling electrons, from the free layers 140 and 158 across the barrier layers 138 and 160 to the reference 136 and free 156 layers, or vice versa, respectively. That is, the single material composition and the consequent electronic band structure of the barrier layers 138 and 160 can determine the effective barrier height and consequently the resistance-area and tunnel magnetoresistive ratio of the stacks 130 and 150, regardless of the size of the free layers 148 and 154.

FIG. 3 displays a portion of an example magnetic stack 180 tuned with a multilayer barrier structure 182 that can provide a predetermined resistance-area and magnetoresistive ratio by optimizing the effective barrier height in accordance with various embodiments. As the multilayer barrier structure 182 can be utilized in a variety of non-limiting data sensing laminations, like the abutted junction and trilayer stacks of FIGS. 2A and 2B, ferromagnetic layers 184 and 186 bookend the barrier structure 182 to generally provide spatial context.

The multilayer barrier structure 182 is constructed with a binary compound layer 188 disposed between and contacting first 190 and second 192 alloy layers. Various embodiments configure the binary compound as an alkaline earth metal combined with a different material to provide a predetermined lattice configuration, such as body centered cubic, and predetermined work function that determines the electrostatic barrier height seen by tunneling electrons.

In a first non-limiting embodiment, the binary compound layer comprises Magnesium Oxide, which can provide high signal-to-noise ratios and compatibility with detection electronics. While the use of MgO can provide structural and operational benefits over a pure non-magnetic barrier layer like Copper, placement of the alloy layers 190 and 192 each constructed of alloys of the metal material in the binary compound layer 188 on opposite sides of the binary compound layer 188 can aid in promoting the predetermined lattice configuration and work function to lower the effective barrier height between the ferromagnetic layers 184 and 186.

The material composition of the alloy layers 190 and 192 can be chosen in some embodiments to match the metal material of the binary compound layer 188, such as Mg, and be combined with a second material having a lower work function than the metal materials. Based on the following equation 1 and the work function property of various elements, the alloy layers 190 and 192 can be tuned to lower the effective barrier height.

$$\varphi_{AB} = \varphi_A + \left(\frac{1.41}{d_A}\right)\left[\frac{(2\varphi_A - \varphi_B - .34)}{(\varphi_A + \varphi_B - .68)}\right] \quad \text{Equation 1}$$

In the equation, $\varphi_A$ is the work function of the element with the smaller work function property, $\varphi_B$ is the element with the larger work function, and $d_A$ is covalent bond strength. While any elements can be used to form the alloy layers 190 and 192, equation 1 yields Barium, Lithium, and Strontium as prospects to be combined with the alkaline earth metal found in the binary compound layer 188 due to having a lower work function than Mg alone and ease of forming binary alloys.

The three prospective elements can additionally provide a lower electronic band gap than MgO when formed as an oxide with a lower oxide barrier height and crystal structure, which could reduce the effective band gap of the binary compound layer 188. Yet another aspect of each of the three elements is that Boron can bond with each element instead of diffusing into the binary compound layer, which can provide a means to reduce ferromagnetic coupling across the barrier structure 182. Thusly, various embodiments form the alloy layers 190 and 192 of the barrier structure 182 of MgBa, MgLi, or MgSr with respective thicknesses 194 and 196 that may or may not match the thickness 198 of the binary compound layer 188 to provide a predetermined resistance-area.

It should be noted that the alloy layers 190 and 192 are not required to have matching material compositions as the first alloy layer 190 may be constructed of MgBa while the second alloy layer 192 is formed of MgSr. Such diverse tuning capabilities can allow for precise resistance-area and effective barrier height tuning catered to a wide variety of data storage environments. The placement and material composition of the alloy layers 190 and 192 on either side of the binary compound layer 188 may provide a reduced resistance-area, but can suffer from deflated magnetoresistive ratios as the alloy layers 190 and 192 may not take the predetermined texture and lattice structure due at least in part to the minimal thickness, such as 0.5-2 Å, and the deposition means like radio frequency sputtering.

Figure 4:
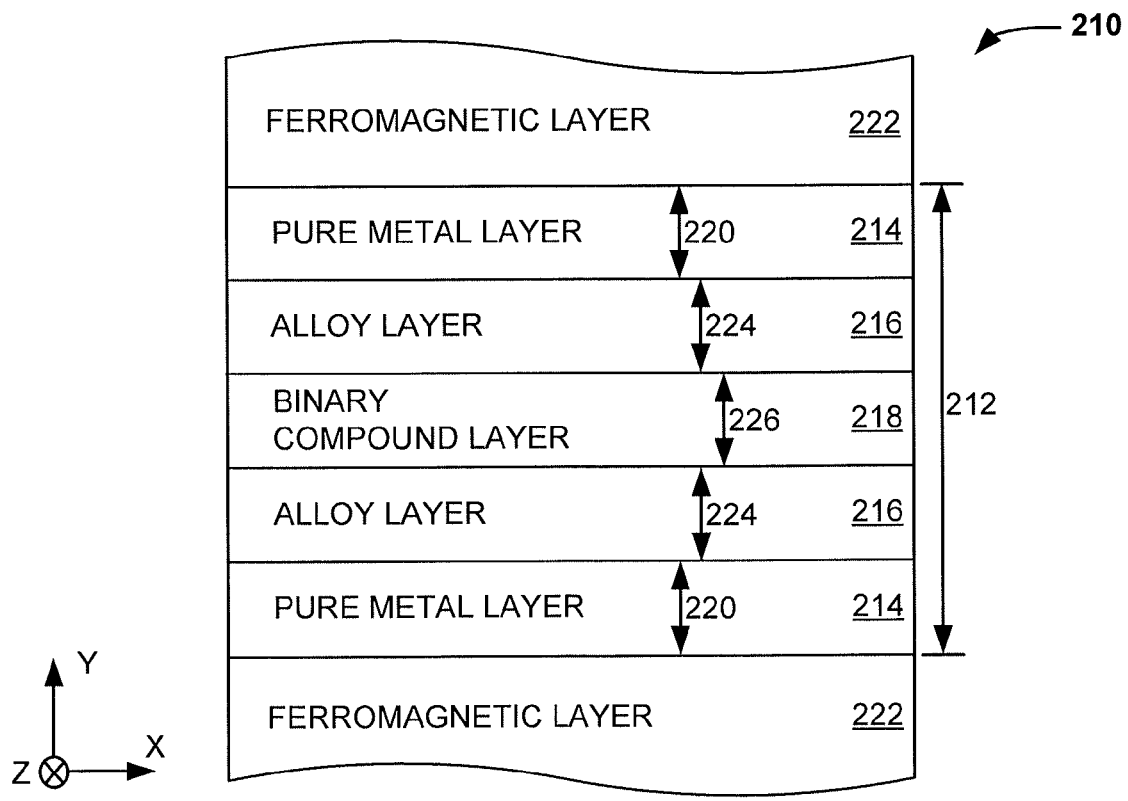
FIG. 4 shows a portion of an exemplary magnetic stack constructed in accordance with some embodiments.

Such concerns may spurn the addition of pure metal layers on opposite sides of the alloy layers 190 and 192. FIG. 4 shows a portion of an example magnetic stack 210 with a multilayer barrier structure 212 that uses pure metal layers 214 as textured seed and cap elements to ensure the predetermined texture and lattice matching for the alloy layers 216 and binary compound layer 218. The addition of the pure metal layers 214 can be in the form of materials that are similar or dissimilar to the alkaline earth metal (i.e. Mg) uniformly used in the binary compound 218 and alloy 216 layers. However, some embodiments do uniformly use a metal, such as Cu, as the pure metal layer 214 and one part of the alloy 216 and binary compound 218 layers.

Regardless of the pure metal layers 214 thickness 220 and material, the position of the layer 214 between the ferromagnetic layers 222 and the alloy layers 216 places metallic material at the interface of the barrier structure 212 and the ferromagnetic layers 222 to provide reduced resistance-area and large magnetoresistive ratios. The metal layer thickness 220 can be adjusted, along with the alloy layer thicknesses 224 and the binary compound layer thickness 226, to provide a predetermined multilayer thickness between the ferromagnetic layers 222. In some embodiments, each layer of the multilayer barrier structure 212 has substantially the same thickness, such as 2 Å, while in other embodiments the pure metal 214 and alloy 216 layers have smaller thicknesses 220 and 224 than the thickness 226 of the binary compound layer 218.

Figure 5:
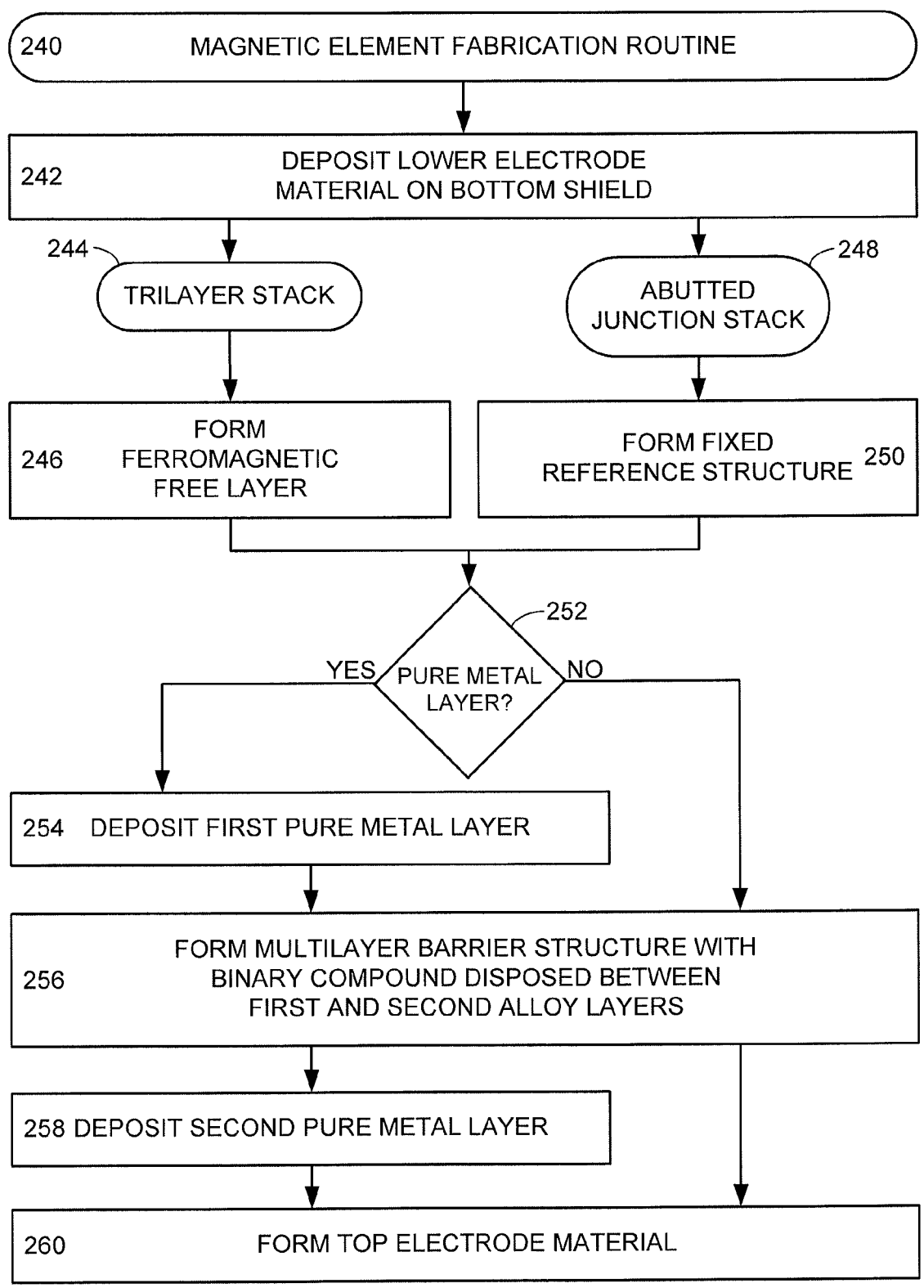
FIG. 5 provides a flowchart of an exemplary magnetic element fabrication routine carried out in accordance with various embodiments.

The ability to tune the various layers of the multilayer barrier structure 212 for respective materials and thicknesses allows for catered optimization of the resistance-area of the electron tunnel junction. Such tuning can occur at any time and may adhere to a predetermined fabrication routine. FIG. 5 provides just such a magnetic element fabrication routine 240 conducted in accordance with various embodiments. While not required or limiting, a lower electrode material may initially be deposited at step 242 and may include at least a ferromagnetic layer, such as a magnetic shield, and may further comprise a seed layer.

The formation of the lower electrode material(s) advances routine 240 to a choice of how the magnetic element is to be configured. Step 244 corresponds with the formation of a trilayer stack lamination where the top and bottom electrodes are ferromagnetic free layers and the stack has no fixed magnetizations, but instead external bias structures like a side shield or bias magnet distal an air bearing surface. In accordance, step 246 forms the first ferromagnetic free layer atop the lower electrode. Conversely, the choice to form an abutted junction stack in step 248 proceeds to step 250 instead of step 246 to form a fixed reference structure, such as a pinned magnetization layer coupled to a ferromagnetic reference layer.

With the lower portion of the magnetic element constructed from steps 242 and either step 246 or 250, decision 252 determines whether or not a pure metal layer is to be inserted. If a pure metal layer is to be positioned between the ferromagnetic layers and the alloy layers of the multilayer barrier structure, step 254 deposits the first pure metal layer of a predetermined material, such as Mg, and with a predetermined thickness. A choice to not include a pure metal layer in the magnetic element or at the conclusion of the deposition of the first pure metal layer advances routine 240 to step 256, which forms the multilayer barrier structure with alloy layers, such as MgX where X is Ba, Li, or Sr, contacting opposite sides of a binary compound layer, such as MgO.

Through various non-limiting embodiments, the alloy layers are formed of MgO that can either be deposited as MgO or formed via oxidation of an Mg layer that may or may not be deposited in the presence of oxygen. The product of either technique is a thin layer of MgO that can be tuned to a predetermined thickness and texture to allow the binary compound layer to be MgBa, MgLi, or MgSr and have a lattice configuration, crystal structure, and work function that corresponds with a predetermined resistance-area. Subsequent to the formation of the multilayer barrier structure in step 256, step 258 deposits a second pure metal layer if the metal layer was chosen from decision 252. No matter whether the second pure metal layer was deposited or not, step 260 forms the top electrode material, such as a ferromagnetic free layer, cap layer, and magnetic shield, atop the multilayer barrier structure to complete the magnetic element.

Prior to the deposition of the top electrode material(s) in step 260, various embodiments can condition the multilayer barrier structure through modified temperature treatments. That is, the stack can be exposed to cryogenic temperatures, such as 50 K, and/or exposed to elevated in-situ thermal temperatures to cause the materials of the multilayer barrier structure to react and provide the predetermined resistance-area, work function, and effective barrier height.

Through the various steps and decisions of routine 240, a magnetic element can be created with an optimized barrier structure tuned with various materials and thicknesses. However, routine 240 is not limited to the steps and decisions provided in FIG. 5 as an unlimited variety of processes can be added to the routine 240 while any of the existing aspects can be modified and deleted, at will. For example, a decision could be included before step 260 to determine if a heat/cooling treatment is to be conducted on the multilayer barrier structure.

With the wide variety of magnetic stack features that can be tuned and optimized, a magnetic element can be created with a reduced effective barrier height and resistance-area. The judicious selection of alkaline earth metal combinations for both the alloy and binary compound layers allows for large magnetoresistive ratios to be achieved despite reduced physical size of the barrier. Moreover, the lower work functions of the alloy and binary compound layers having the same root metal element may yield a more robust tunneling barrier without increasing effective barrier height. In addition, while the embodiments have been directed to magnetic sensing, it will be appreciated that the claimed invention can readily be utilized in any number of other applications, including data storage device applications.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed. For example, the particular elements may vary depending on the particular application without departing from the spirit and scope of the present disclosure.

What is claimed is:

1. An apparatus comprising a magnetic stack with a multilayer barrier structure disposed between first and second ferromagnetic layers, the multilayer barrier structure having a binary compound layer disposed between first and second alloy layers, the binary compound comprising a metal element and a second element, at least one alloy layer comprising the metal element and a third element chosen from the group of Ba, Sr, and Li.

2. The apparatus of claim 1, wherein the metal element comprises Magnesium.

3. The apparatus of claim 1, wherein the second element comprises Oxygen.

4. The apparatus of claim 1, wherein the second element comprises Barium.

5. The apparatus of claim 1, wherein the second element comprises Lithium.

6. The apparatus of claim 1, wherein the second element comprises Strontium.

7. The apparatus of claim 1, wherein the magnetic stack comprises a trilayer lamination having first and second magnetically free layers without a fixed reference magnetization.

8. The apparatus of claim 1, wherein the magnetic stack comprises an abutted junction lamination having a fixed magnetization reference structure opposite the multilayer barrier structure from a magnetically free layer.

9. The apparatus of claim 1, wherein each alloy layer is disposed between one of the first and second ferromagnetic layers and the binary compound layer.

10. The apparatus of claim 9, wherein the first and second alloy layers have dissimilar material compositions.

11. The apparatus of claim 1, wherein the first and second alloy layers have the same material composition.

12. The apparatus of claim 1, wherein the binary compound layer and at least one alloy layer each have a common thickness.

13. The apparatus of claim 1, wherein the binary compound layer and at least one alloy layer each have dissimilar thicknesses.

14. The apparatus of claim 1, wherein a pure metal layer is disposed between the at least one alloy layer and the first ferromagnetic layer, the pure metal layer comprising an alkaline earth metal material.

15. A magnetic element comprising:
a magnetic stack with a multilayer barrier structure disposed between first and second ferromagnetic layers and between first and second pure metal layers, the multilayer barrier structure having a binary compound layer disposed between first and second alloy layers, the binary compound comprising MgO, each alloy layer comprising MgX where X is chosen from the group of: Ba, Sr, and Li.

16. The magnetic element of claim 15, wherein each pure metal layer comprises the metal element of the binary compound.

17. The magnetic element of claim 15, wherein the binary compound layer comprises MgX where X is chosen from the group of: Ba, Sr, and Li, each alloy layer is MgO, and each pure metal layer is Mg.

18. A method comprising:
constructing a lower electrode portion of a magnetic stack with at least one ferromagnetic layer;
forming a multilayer barrier structure atop the lower electrode portion, the multilayer barrier structure having a binary compound layer disposed between first and second alloy layers, the binary compound comprising a metal element and a second element, at least one alloy layer comprising the metal element and a third element chosen from the group of: Ba, Sr, and Li; and
depositing a top electrode portion a magnet stack with at least one ferromagnetic layer atop the multilayer barrier structure.

19. The method of claim 18, further comprising cooling the magnetic stack to a cryogenic temperature prior to the depositing step.

20. The method of claim 18, further comprising heating the magnetic stack to an elevated temperature prior to the depositing step.

* * * * *